US008561976B2

(12) United States Patent
Dunn et al.

(10) Patent No.: US 8,561,976 B2
(45) Date of Patent: Oct. 22, 2013

(54) TRANSPORTABLE CARRIER COMPATABLE WITH A RETRACTABLE PIN TOOL

(75) Inventors: William Dunn, Alpharetta, GA (US); Ware Bedell, Cumming, GA (US)

(73) Assignee: American Panel Corporation, Alpharetta, GA (US)

( * ) Notice: Subject to any disclaimer, the term of this patent is extended or adjusted under 35 U.S.C. 154(b) by 993 days.

(21) Appl. No.: 12/491,963

(22) Filed: Jun. 25, 2009

(65) Prior Publication Data

US 2010/0028108 A1 Feb. 4, 2010

Related U.S. Application Data

(63) Continuation-in-part of application No. 12/056,849, filed on Mar. 27, 2008, now Pat. No. 8,499,437.

(60) Provisional application No. 61/075,737, filed on Jun. 25, 2008.

(51) Int. Cl.
*H05K 13/00* (2006.01)

(52) U.S. Cl.
USPC .......................................... 269/287; 269/903

(58) Field of Classification Search
CPC .......... B23Q 3/06; B23Q 16/08; B65G 49/05; G02F 1/133308; H01L 21/6734; H05K 13/04; H05K 2203/167; H05K 3/30; H05K 7/02; H05K 7/04; H05K 7/06; H05K 7/14
USPC ........... 29/603.06, 426.1, 428, 469, 603, 711, 29/721, 729, 739, 742, 760; 206/316.1, 206/451, 706, 707, 709, 710, 711, 724, 206/725; 349/58, 59, 60, 187; 414/222.01, 414/225.01, 806; 438/106, 117, 121, 125, 438/126; 445/23, 60, 66, 67; 345/98; 269/47, 48, 48.2, 53, 54.1, 54.4, 54.5, 269/287, 900, 903
IPC .......................... B23Q 3/06,16/08; B65G 49/05
See application file for complete search history.

(56) References Cited

U.S. PATENT DOCUMENTS

| | | | | | |
|---|---|---|---|---|---|
| 3,392,256 | A | * | 7/1968 | Bradham, III | 219/79 |
| 3,516,155 | A | * | 6/1970 | Smith | 29/839 |
| 3,615,006 | A | * | 10/1971 | Freed | 206/454 |
| 4,290,838 | A | * | 9/1981 | Reavill et al. | 156/286 |
| 4,706,161 | A | * | 11/1987 | Buckingham | 361/220 |
| 4,908,087 | A | * | 3/1990 | Murooka et al. | 156/286 |
| 5,038,251 | A | * | 8/1991 | Sugiyama et al. | 235/61 R |
| 5,074,798 | A | * | 12/1991 | Carter | 439/72 |
| 5,109,980 | A | * | 5/1992 | Matsuoka et al. | 206/724 |

(Continued)

*Primary Examiner* — Saul Rodriguez
*Assistant Examiner* — Brendan Tighe
(74) *Attorney, Agent, or Firm* — Standley Law Group LLP

(57) ABSTRACT

A device for providing support to an LCD and its corresponding components during various manufacturing steps. A first carrier section is positioned on a work surface and is then loaded with an LCD as well as drivers to be bonded to the tabs of the LCD. Once the desired work has been performed a second carrier section is mated with the first carrier section and a closing means is utilized to position the two carrier sections in a closed position. Once the two carrier sections have been placed in a closed position about the LCD and other components, the entire piece may be safely removed from its position on the work surface for further processing, storage, etc. Exemplary embodiments also relate to a method of providing support to an LCD and its corresponding components during various manufacturing steps.

15 Claims, 15 Drawing Sheets

(56) References Cited

U.S. PATENT DOCUMENTS

| | | | |
|---|---|---|---|
| 5,158,490 A * | 10/1992 | Kong | 445/66 |
| 5,303,820 A * | 4/1994 | Comtois | 206/706 |
| 5,329,391 A * | 7/1994 | Miyamoto et al. | 349/60 |
| 5,447,886 A * | 9/1995 | Rai | 228/180.22 |
| 5,531,328 A * | 7/1996 | Rochelo et al. | 206/706 |
| 6,164,636 A * | 12/2000 | Taylor | 269/287 |
| 6,202,293 B1 * | 3/2001 | Schaller et al. | 29/760 |
| 6,507,377 B1 * | 1/2003 | Jung | 349/60 |
| 7,460,704 B2 * | 12/2008 | Tischner et al. | 382/152 |
| 7,517,419 B2 * | 4/2009 | Nogiwa et al. | 156/152 |
| 8,459,627 B2 * | 6/2013 | Chan et al. | 269/287 |
| 2004/0080730 A1 * | 4/2004 | Binnard | 355/53 |
| 2005/0034675 A1 * | 2/2005 | Nakabayashi et al. | 118/728 |
| 2006/0260978 A1 * | 11/2006 | Gregerson et al. | 206/710 |
| 2006/0266718 A1 * | 11/2006 | Tischner et al. | 211/41.18 |
| 2007/0167102 A1 * | 7/2007 | Yonehara et al. | 445/24 |
| 2008/0173560 A1 * | 7/2008 | Umeda et al. | 206/316.1 |
| 2009/0243988 A1 * | 10/2009 | Bedell | 345/98 |
| 2010/0028108 A1 * | 2/2010 | Dunn et al. | 414/225.01 |
| 2012/0139176 A1 * | 6/2012 | Di Stefano | 269/287 |

* cited by examiner

US 8,561,976 B2

TRANSPORTABLE CARRIER COMPATABLE WITH A RETRACTABLE PIN TOOL

CROSS REFERENCE TO RELATED APPLICATIONS

This application claims priority to provisional application No. 61,075,737 filed on Jun. 25, 2008. This application is a continuation-in-part of U.S. patent application Ser. No. 12/056,849, entitled RETRACTABLE PIN TOOL filed on Mar. 27, 2008.

TECHNICAL FIELD

Exemplary embodiments relate generally to a device and method to be used in conjunction with a retractable pin tool. More particularly, the exemplary embodiments relate to a device and method for providing protection to and a work surface for an LCD and its components while it is being worked on with a retractable pin tool as well as during other steps of the manufacturing process.

BACKGROUND AND SUMMARY OF THE INVENTION

Flat panel displays using liquid crystal display (LCD) technology are widely known and have found application in a number of fields for displaying visual information. In a flat panel LCD, the screen area, which is substantially rectangular, is divided into a large number of individual color dots. Each set of color dots is capable of displaying a full color gamut. It is known for the sets to comprise a three-dot combination of red, green and blue, a four-dot combination of red, green, green and blue, a four-dot combination of red, green, blue and white, and a six-dot combination of red, green, blue, yellow, cyan and magenta, as well as other combinations that allow a full color display. In an active matrix flat panel LCD, each color dot contains a transistor switch. A liquid crystal fluid, contained between a front plate and a rear plate, is twisted by a voltage which changes the axis of polarization of light, allowing the individual color dots to transmit or block light passing from a backlight source through the individual color filters. The color dots are arranged in a grid comprising rows and columns, and there can be several hundred or thousand vertical columns of color dots going across the display as well as hundreds or thousands of horizontal rows of color dots, resulting in most cases in more than 1,000,000 individual color dots. Each color dot has a vertical column and horizontal row grid address and is driven by electrical impulses fed along its respective row from a bus located on one of the side edges of the flat panel LCD and along its respective column from a top or bottom edge of the flat panel LCD. In general, the horizontal row drivers are referred to as gate drivers and the vertical column drivers are referred to as source drivers, but these may be reversed in practice, as will be known to those of skill in the art. In either case, the source driver signal provides the gray scale data for a given color dot, while the gate driver signal changes a given line of thin film transistors ("TFTs") from "off" to "on" for a given "line time." This signal from the gate driver thereby allows the charging of a capacitor associated with the individual color dot, determining the voltage held by the color dot for an entire frame period.

During the manufacture of a flat panel LCD, the panel that comprises the liquid crystal fluid and the front and rear plates contains flexible printed circuit elements that function as input and output for the gate, source, and heater driver circuit card assemblies. These circuit elements, or "tabs," contain electrical contacts, or "pads," that must be properly aligned with matching electrical contacts on each respective driver circuit card assembly in order for all the color dots to receive electrical signals and respond properly. An anisotropic, electrically conductive adhesive is typically used to make the electrical connection between the pads on the tabs of the LCD and the pads on each driver circuit card assembly, or "driver." Alignment is key, as misalignment can result in a LCD display where parts of the screen are either partially or completely unresponsive to electrical signals, and is unsuitable for sale. Furthermore, because LCD tabs are very fragile the process of aligning a tab with a driver can damage an LCD if the tabs are allowed to flex, shift, or rub against the drivers or other surfaces during the alignment process.

U.S. patent application Ser. No. 12/056,849 discloses a retractable pin tool device and method that may be used in the manufacture of flat panel display devices. This application hereby incorporates U.S. patent application Ser. No. 12/056,849 by reference in its entirety. An exemplary embodiment of the retractable pin tool device of said application enables alignment of an LCD panel with adhered tabs with driver circuit card assemblies. The known art has yet to provide a carrier for protecting, transporting, etc. an LCD with adhered tabs that have been aligned upon a driver where said carrier is also capable of providing a work surface during various steps of the manufacturing process.

An exemplary embodiment includes a transportable carrier for an LCD with adhered tabs that have been aligned upon a driver. In a preferred exemplary embodiment, a first carrier section is placed about a retractable pin tool. To ensure proper alignment of the carrier about the tool, the pin tool device may be equipped with two pins that match up with corresponding reciprocals on the first carrier section. In this preferred exemplary embodiment, an LCD with adhered tabs may be placed in the first carrier section after the carrier section has been positioned about a retractable pin tool and then work can be performed to bond the tabs of the LCD to paths on drivers that have also been positioned within the first carrier section. Subsequently, once the work being performed on the LCD and its corresponding components has reached a stopping point, a second carrier section may be positioned over the first carrier section and then secured to the first carrier section via a closing means. In a preferred exemplary embodiment, the first and second carrier sections are clamped together such that they then form a single unit which encases an LCD and its components that were being processed. The single unit carrier comprising the first and second carrier sections may then be removed from its position about a retractable pin tool so that it may be stored safely until the next time work is to be performed on the contents of the carrier.

Exemplary embodiments may comprise a transportable carrier that also provides a work surface while tabs attached to an LCD are being aligned upon a driver. In a preferred exemplary embodiment, the transportable carrier device comprises a first carrier section formed of a machined, phonetic material that will not hold an electric charge. In another exemplary embodiment, the transportable carrier may assist in the use of a retractable pin tool by providing additional support to the tool and by keeping various components that are being worked on level with certain portions of the pin tool. Other exemplary embodiments may provide a means of storing an LCD, the tabs attached to the LCD, the drivers, and various other components during times the unit is not being worked on such that the LCD and the other components are protected. In some embodiments, the transportable carrier device may be further used as an alignment tool that enables more accurate positioning of parts onto the LCD by the retractable pin tool.

BRIEF DESCRIPTION OF THE DRAWINGS

A better understanding of the disclosed embodiments will be obtained from a reading of the following detailed description and the accompanying drawings wherein identical reference characters refer to identical parts and in which.

DETAILED DESCRIPTION

Figure 1:
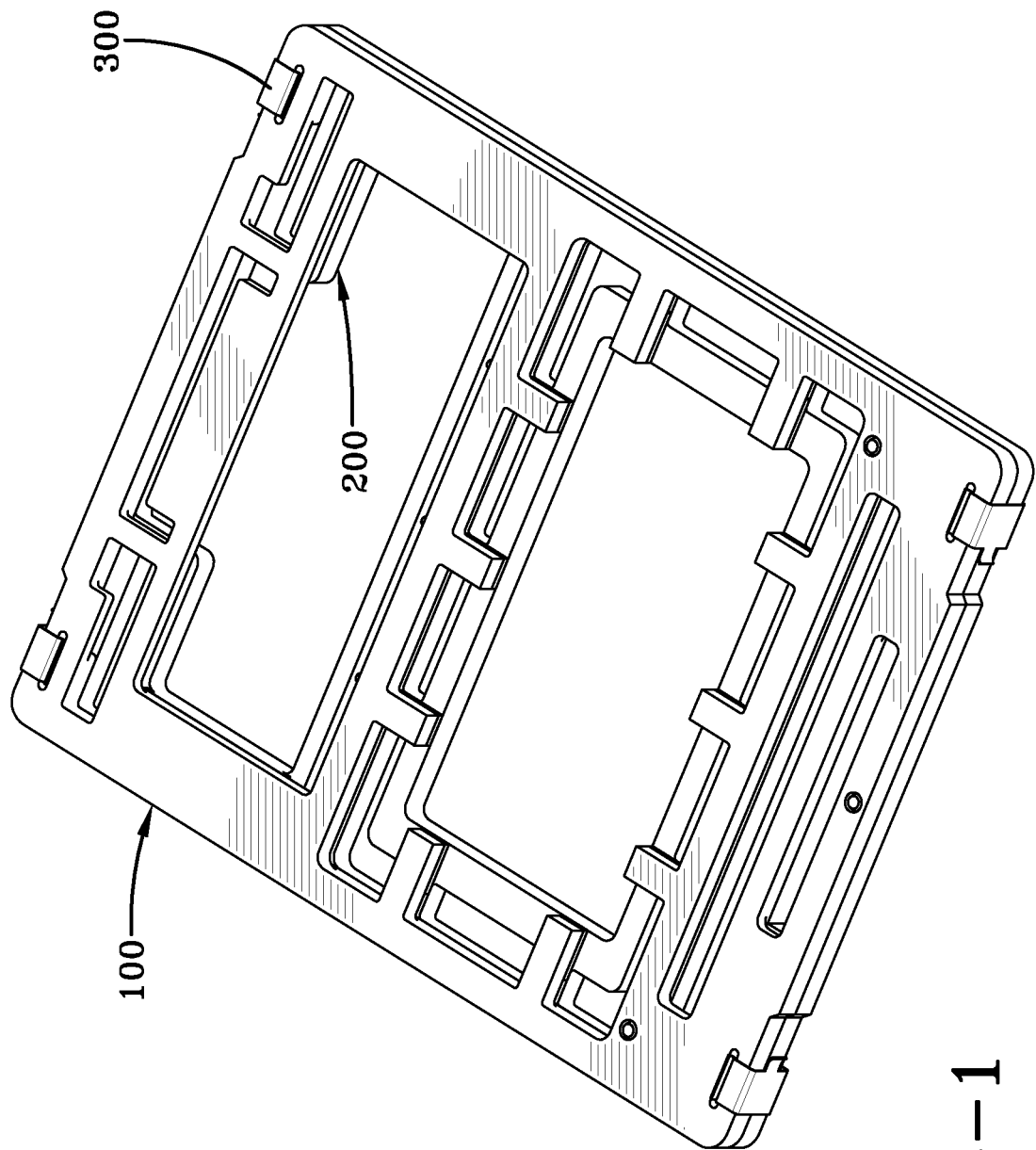
FIG. 1 shows a bottom perspective view of an exemplary embodiment of a first carrier section and a second carrier section in a closed position.
Figure 2:
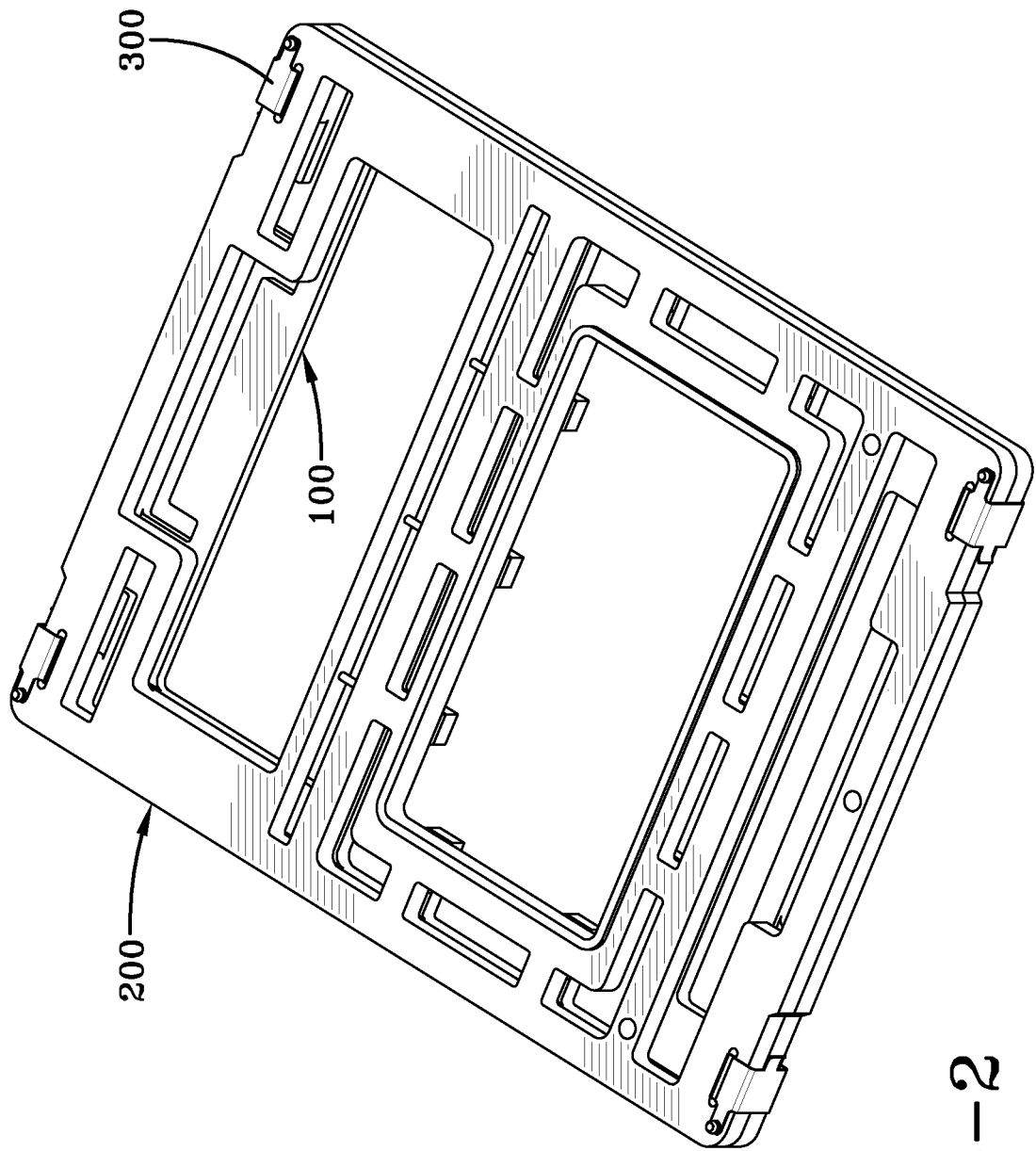
FIG. 2 shows a top perspective view of the exemplary embodiment depicted in FIG. 1.
Figure 3:
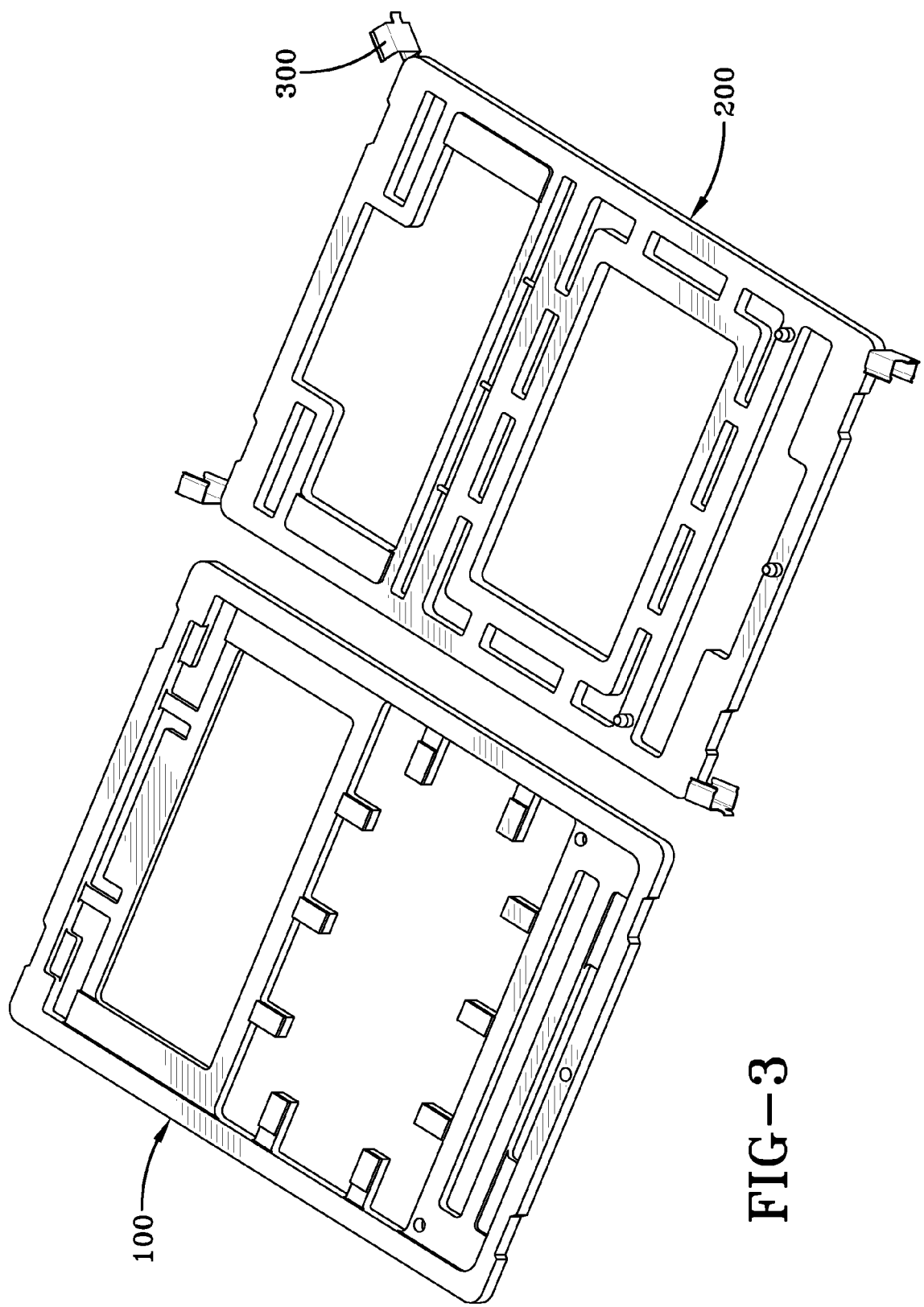
FIG. 3 shows a perspective view of the exemplary embodiment of the first carrier section and the second carrier section of FIG. 1 shown in an opened position.

An exemplary embodiment of a transportable carrier comprises a first carrier section 100 and a second carrier section 200 capable of being mated together and secured in a closed position via a closing means 300. As used in this application, the phrase "closed position" means a position where at least one surface of the device which would otherwise be immediately accessible has been put in direct contact with another surface and because of this contact the surface of the device is no longer immediately accessible. FIG. 1 shows a bottom perspective view of an exemplary embodiment of a first carrier section 100 and a second carrier section 200 being secured in a closed position by an exemplary embodiment of a closing means 300. As shown in FIG. 1, the closing means 300 may comprise a clamp that fits around a first carrier section 100 and a second carrier section 200 and is able to maintain them in a closed position until it is selectively removed. Many different devices other than a clamp are capable of performing the function of closing means 300. For example in some exemplary embodiments closing means 300 may comprise a screw, nail, banding, etc. FIG. 2 shows a top perspective view of the exemplary embodiments shown in FIG. 1. FIG. 3 shows a perspective view of the exemplary embodiments shown in FIG. 1 where the closing means 300 has been selectively undone and the first carrier section 100 and the second carrier section 200 have been placed in an open position.

Figure 4:
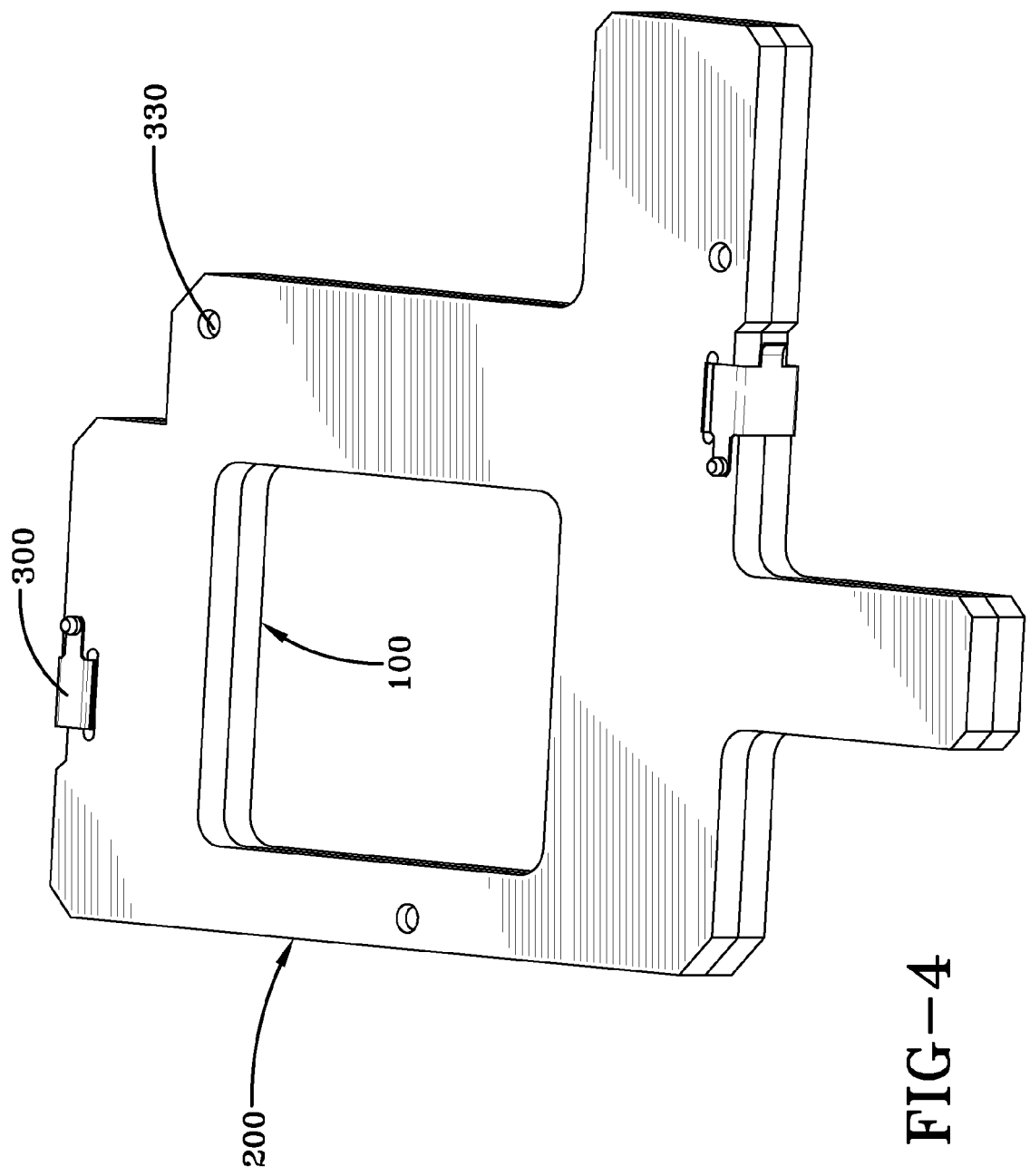
FIG. 4 shows a perspective view of a second exemplary embodiment of a first carrier section and a second carrier section in a closed position.
Figure 5:
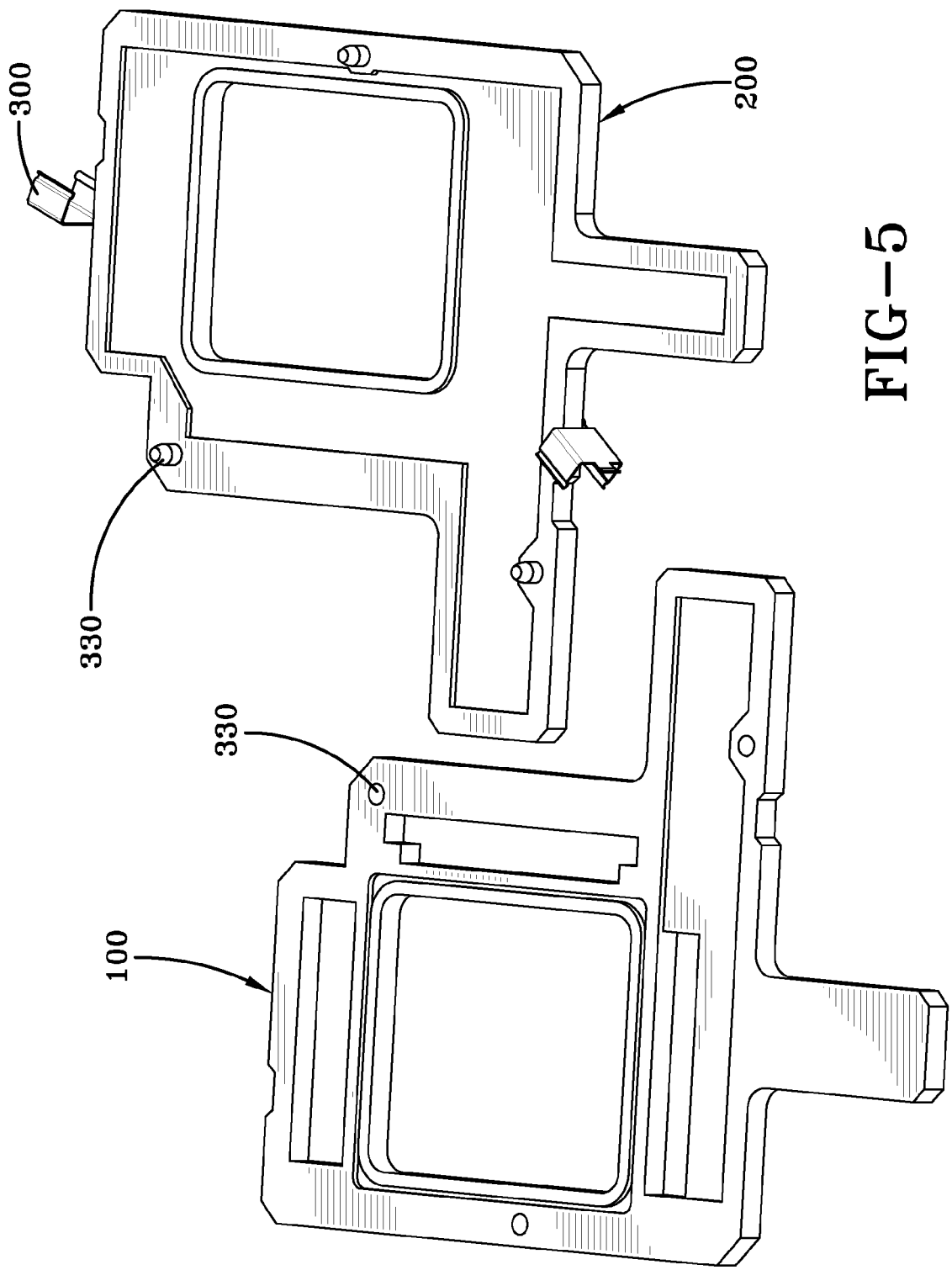
FIG. 5 shows a perspective view of the exemplary embodiment shown in FIG. 4 with the first carrier section and second carrier section in an opened position.

In a preferred exemplary embodiment, mating a first carrier section 100 and a second carrier section 200 in order to place them in a closed position can be completed with the assistance of a means for mating 330 that has been built into either the first carrier section 100 or the second carrier section 200 or perhaps built into both carrier sections. In some exemplary embodiments, the mating means 330 comprises bullet nose pins, tongue and groove, etc. FIG. 4 shows a perspective view of a second exemplary embodiment of a first carrier section 100 and a second carrier section 200 in a closed position where both the first and second carrier sections comprise a mating means 330 that comprises bullet nose pins. Utilization of the mating means 330 may eliminate the need to slide the second carrier section 200 over the first carrier section 100 to achieve a perfect fit. Eliminating this sliding may be desirable because the LCD and its corresponding components, which are often placed into the first carrier section 100 prior to being mated with the second carrier section 200, are very fragile and could easily be damaged by the sliding movement. In some embodiments, the mating means 330 may comprise something other than bullet nose pins. For example, in one exemplary embodiment, the mating means 330 may be a feature built into the closing means 300. FIG. 5 shows a perspective view of a second exemplary embodiment of a first carrier section 100 and a second carrier section 200 that have been placed in an open position.

In a preferred exemplary embodiment, a transportable carrier comprises machined phenolic material that does not hold a charge. A phenolic material is any of the various synthetic thermosetting resins, obtained by the reaction of phenols with simple aldehydes and is often used to make molded products and as coatings and adhesives. In some embodiments, the material that forms the carrier may be entirely phenolic, but in other exemplary embodiments the carrier is formed mainly of material that is not phenolic and the phenolic material is used in isolated areas within the carrier. For example, an exemplary embodiment of a carrier may comprise aluminum with phenolic inserts. The phenolic inserts can be positioned within the carrier where they are needed to prevent the conduction of electricity. Such a composition may be desirable when the carrier will be used as a protective casing about an LCD and its corresponding components for an extended period of time because aluminum is stronger than most phenolic materials and will not warp under pressure like a carrier might if it were made entirely out of phenolics. In another exemplary embodiment, a carrier may comprise a fine-weave cotton and phenolic composition which prevents static build up. While it will often times be desirable for a carrier to comprise phenolic material there are also embodiments comprised entirely of non-phenolics.

Figure 6:
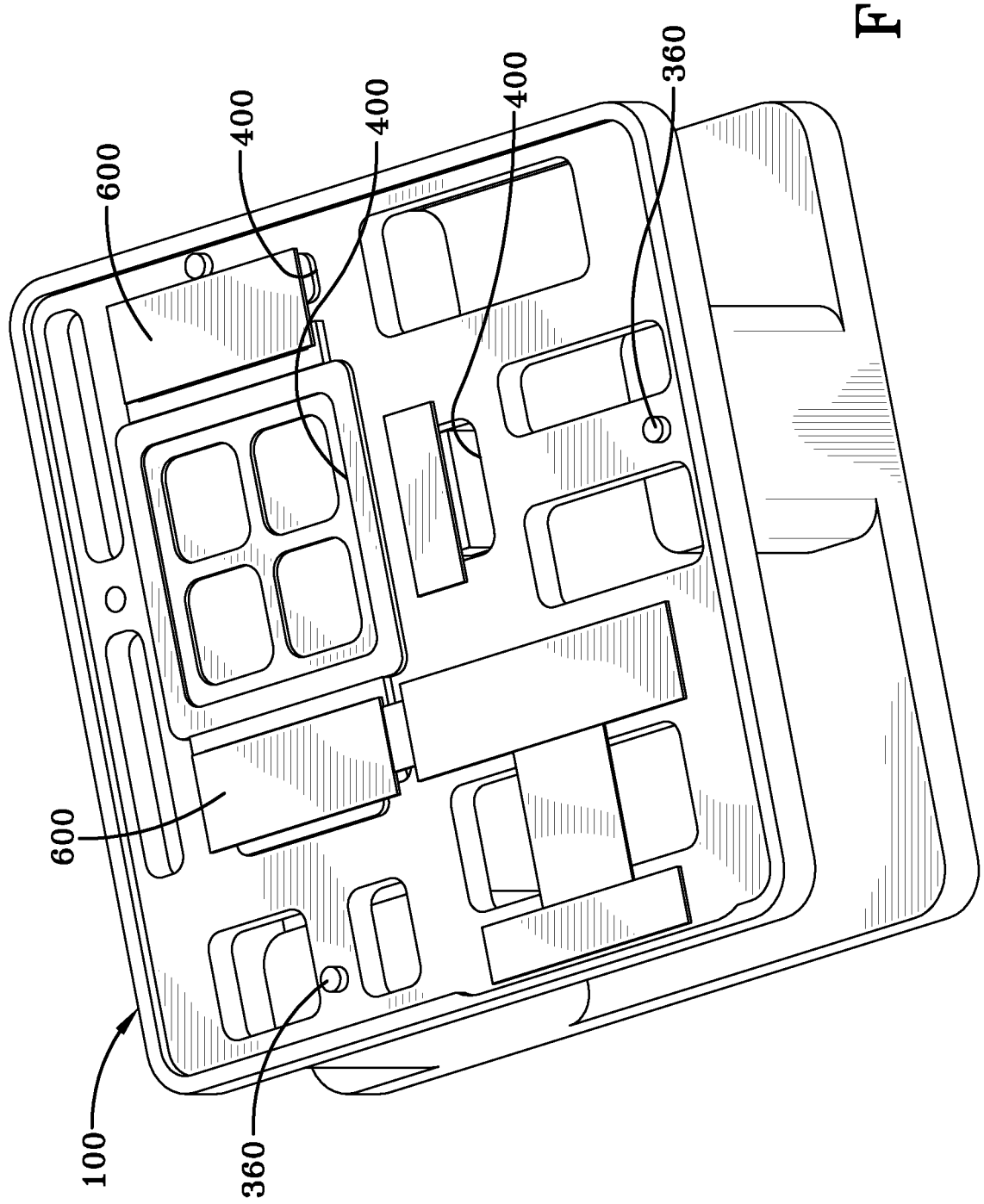
FIG. 6 shows a perspective view of an exemplary embodiment of a first carrier section shown about a retractable pin tool.

In a preferred exemplary embodiment, a first carrier section 100 may be placed about a retractable pin tool. The first carrier section 100 may define an opening 400 for receiving a portion of a retractable pin tool when the first carrier section 100 has been placed about said tool. In some exemplary embodiments, a first carrier section 100 defines multiple openings 400 where each opening 400 can receive a portion of the retractable pin tool about which the first carrier section 100 has been positioned. FIG. 6 shows a perspective view of an exemplary embodiment of a first carrier section 100 shown about a retractable pin tool wherein the first carrier section 100 defines an opening 400 that can receive a portion of the retractable pin tool. In fact, the exemplary embodiment of a first carrier section 100 shown in FIG. 6 defines multiple openings 400 that each can receive a portion of the retractable pin tool. As shown in FIG. 6, the first carrier section 100 can also define openings 400 that do not receive a portion of the retractable pin tool even when the first carrier section 100 is placed about the tool.

An exemplary embodiment of a transportable carrier may further comprise a first carrier section 100 adapted to sit about a retractable pin tool. In a preferred exemplary embodiment, a first carrier section 100 is adapted to sit about a retractable pin tool by having strategically placed openings 400 which receive a portion of the retractable pin tool. In another exemplary embodiment, the transportable carrier may be adapted to sit about a retractable pin tool by being capable of being positioned on the tool in a way such that drivers housed in the first carrier section 100 may be engaged by pins on the pin tool without the first carrier section 100 defining openings 400 for receiving a portion of the tool. In this exemplary embodiment, the pins of the retractable pin tool may be long enough such that they can extend through the entire width of the first carrier section 100 and into a driver housed on the first carrier section 100. In another exemplary embodiment, a first carrier section 100 is adapted to sit about a retractable pin tool by comprising a fastening means which can selectively be done and undone to secure the carrier section to the tool. In another exemplary embodiment, a first carrier section 100 is adapted to sit about a retractable pin tool because the first carrier section 100 comprises a positioning means 360.

In some exemplary embodiments, placing a first carrier section 100 about a retractable pin tool may be done with the assistance of positioning means 360. The positioning means 360 may comprise pins that are located on either the retractable pin tool or on the first carrier section 100. In this embodiment, the pins may extend from one device into reciprocals that are located on the other device. This can ensure that the first carrier section 100 is placed about the retractable pin tool in the right configuration such that the pins on the tool will properly align with components that are later placed on the first carrier section 100. Various devices, other than pins, could perform the function of assisting with the placement of a first carrier section 100 about a retractable pin tool. In some exemplary embodiments, positioning means 360 may also serve as mating means 330. FIG. 6 shows an exemplary embodiment of a positioning means 360.

In one exemplary embodiment, a first carrier section 100 is adapted to receive an LCD and its corresponding components. In a preferred embodiment, a first carrier section 100 is adapted to receive an LCD by comprising a frame into which the LCD can be positioned. The frame may be the same shape as the LCD which is to be housed in the first carrier section 100, but larger in size so that the LCD can fit down into the frame and be held in place. There are many different configurations of frames that could receive an LCD. In other exemplary embodiments, a first carrier section 100 is adapted to receive an LCD by comprising an LCD attachment means. The LCD attachment means may be clamps that are secured to the LCD and the carrier but it could also be something that has a less secure hold on the LCD such as a material with a non-slip surface upon which the LCD is positioned.

The first carrier section 100 may further be adapted to receive various components to be bonded to an LCD or other parts required during processing of the LCD. In a preferred embodiment, a first carrier section 100 is adapted to receive drivers that are to be bonded to the tabs of an LCD. This may mean that the shape of the carrier is designed such that it can physically house all of the drivers to be bonded to the LCD. In another exemplary embodiment, the first carrier section 100 is adapted to receive drivers to be bonded to an LCD by defining multiple openings 400 that each receive a portion of a retractable pin tool about which the carrier is placed and the drivers are to be positioned over the defined openings 400 such that pins from the retractable pin tool may engage the drivers. In other exemplary embodiments, a carrier is adapted to receive other components related to the processing of an LCD such as tools, bonding materials, supplies, etc. In this vein, some exemplary embodiments of a transportable carrier can function as a type of tool box or work center.

Figure 14:
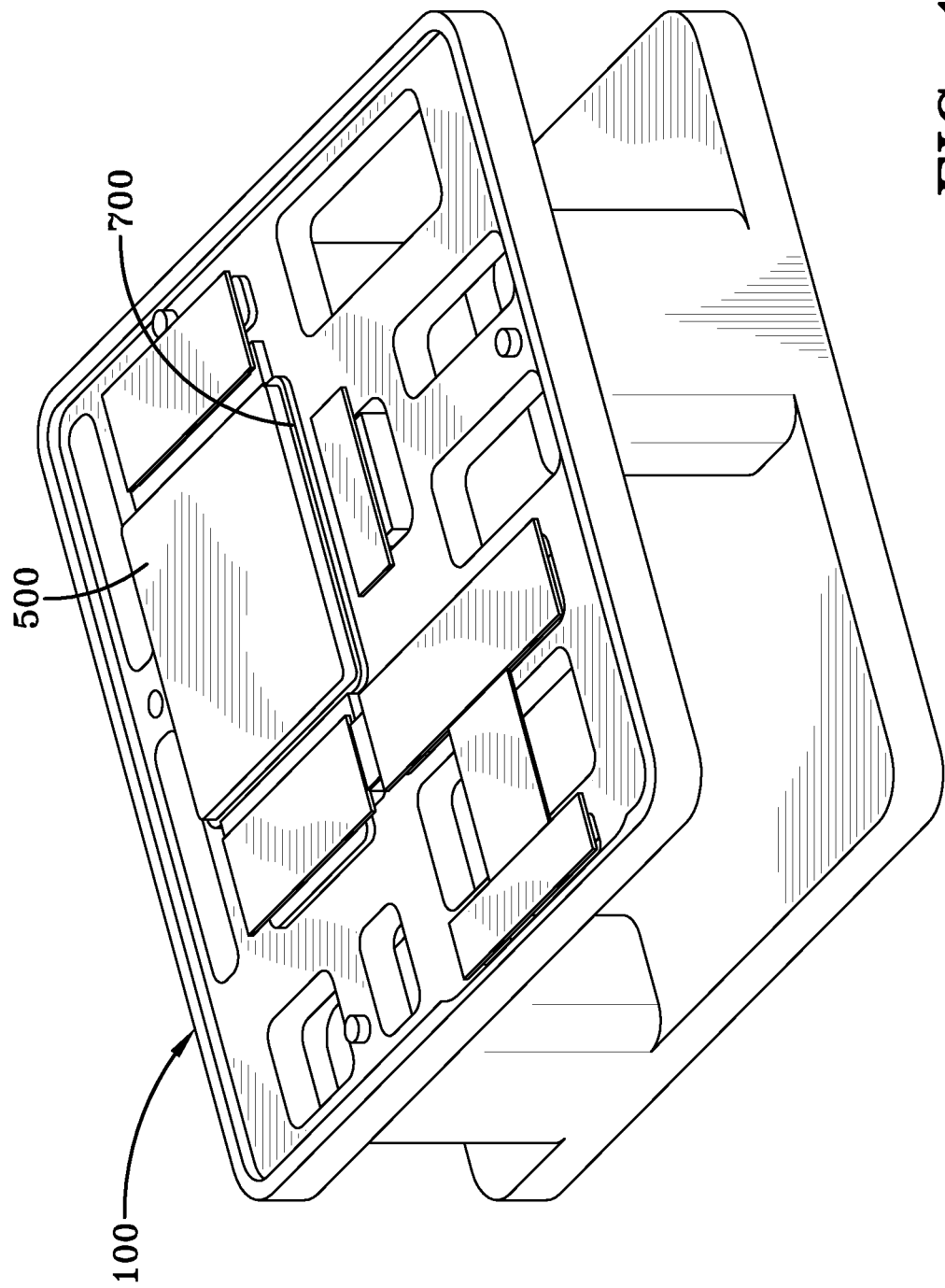
FIG. 14 shows a top perspective view of the exemplary embodiment shown in FIG. 12 where the first carrier section has been loaded with an LCD and various drivers to be bonded to the tabs of the LCD.

In an exemplary embodiment where a first carrier section 100 is placed about a retractable pin tool, the first carrier section 100 may then be loaded with an LCD 500 and various drivers 600 to be bonded to the tabs of the LCD 500. In this exemplary embodiment, the first carrier section 100 may comprise openings 400 for receiving a portion of the retractable pin tool. If this is the case, the drivers 600 may be positioned over the defined openings 400. In this exemplary embodiment, the portions of the retractable pin tool that are received by the openings 400 defined by the first carrier section 100, may be such that they are level with the edges of the first carrier section 100 that define the openings 400. When the drivers 600 have been positioned over portions of the retractable pin tool, pins from the tool can be raised such that they go through holes that have been made in the drivers 600. In a preferred exemplary embodiment, raising the pins from the retractable pin tool through corresponding holes on the drivers 600, ensures that the drivers 600 are properly aligned for bonding with the tabs that are located on the LCD 500. The exemplary embodiment shown in FIG. 6 is configured such that the edges of the first carrier section 100 that define the openings 400 that receive portions of the retractable pin tool, sit level with the received portions of the retractable pin tool, when the first carrier section 100 has been positioned properly about the tool. FIG. 6 additionally shows an exemplary embodiment of how a first carrier section 100 can receive a driver 600. FIG. 14 shows an exemplary embodiment of a first carrier section 100 receiving an LCD 500.

Figure 15:
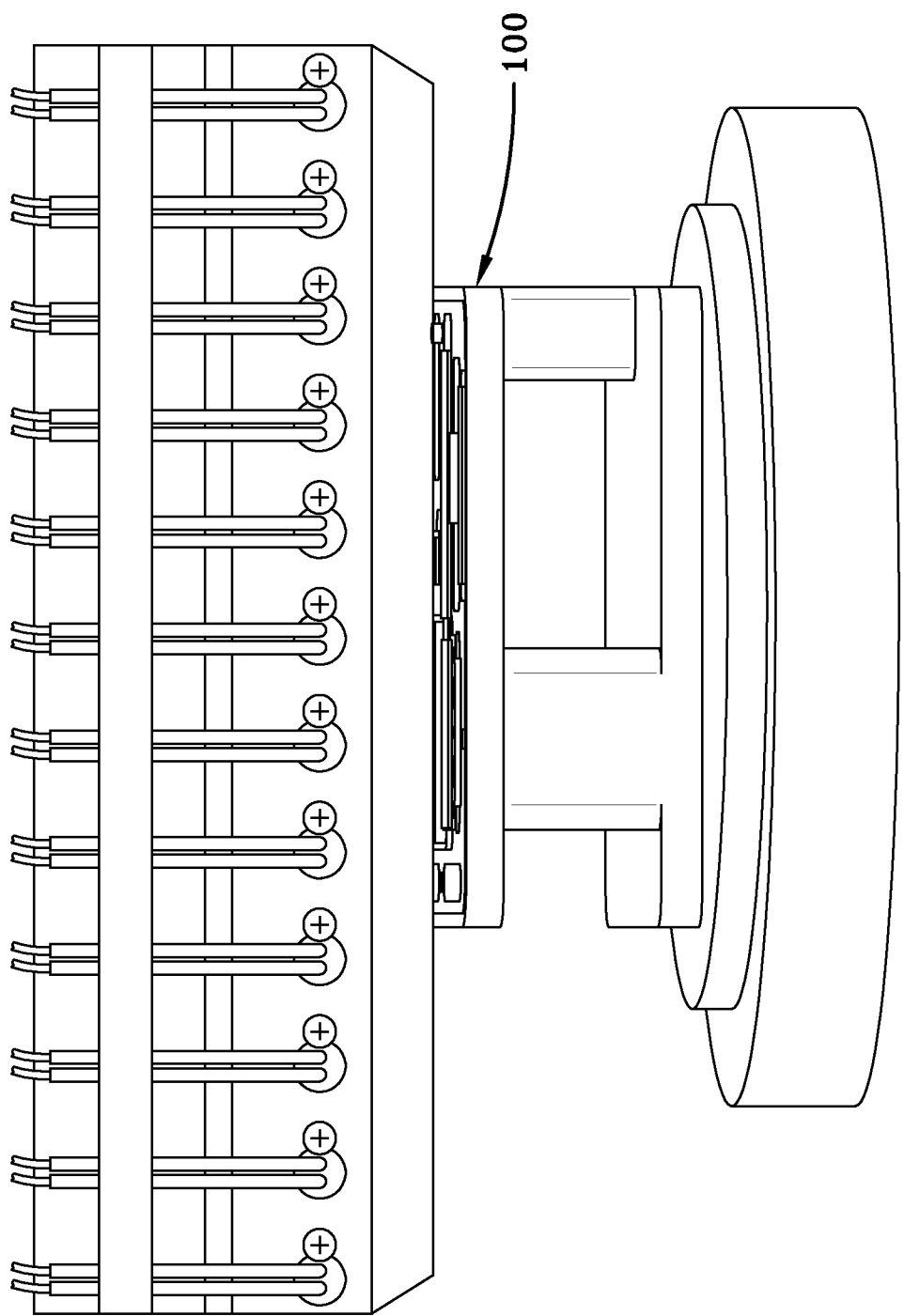
FIG. 15 shows a perspective view of the exemplary embodiment shown in FIG. 14 where the embodiment is shown positioned under a hot bar.

In some exemplary embodiments, building a first carrier section 100 such that it sits flush with portions of the retractable pin tool that have been received by the openings 400 in the first carrier section 100 helps reduce the amount of force placed on the LCD and its components as they are being processed. For example, when a hot bar is utilized to make certain bonds that have been made to the LCD and its components during processing permanent, the applied heat could cause the drivers to morph. However, when the drivers 600 are supported by portions of the retractable pin tool as well as portions of a first carrier section 100 that are level with each other, morphing of the drivers 600 may be minimized or prevented entirely. FIG. 15 shows an exemplary embodiment of a first carrier section 100 housing and LCD and its corresponding components where the first carrier 100 is shown positions about a retractable pin tool and under a hot bar.

In an exemplary embodiment where a first carrier section 100 has been placed about a retractable pin tool and the first carrier section 100 has been loaded with an LCD 500 and various drivers 600 work can be performed on the LCD, the tabs of the LCD, the drivers 600 and/or other components that may have also been loaded into the first carrier section 100 while the first carrier section 100 remains positioned about the retractable pin tool. The work being performed may be of the type that is conducted with a retractable pin tool, but it may also be work of another nature. Thus, in some exemplary embodiments, the first carrier section 100 provides a work surface for various processing steps conducted on LCD components prior to the completion of manufacturing.

In a preferred exemplary embodiment, there is a certain task that needs to be performed on various components that have been loaded into a first carrier section 100, but once that task has been performed it is necessary to remove the first carrier section 100 and the components it houses away from the retractable pin tool. In this exemplary embodiment, there may be a second carrier section 200 that is capable of being mated with the first carrier section 100 and then the first carrier section 100 and second carrier section 200 may be placed into a closed position about the various components housed on the first carrier section 100 via closing means 300. In a preferred embodiment, once the first carrier section 100 and second carrier section 200 have been placed in a closed position as just described, they form a single unit that may then be removed from about the retractable pin tool for further processing, storage, etc.

Figure 7:
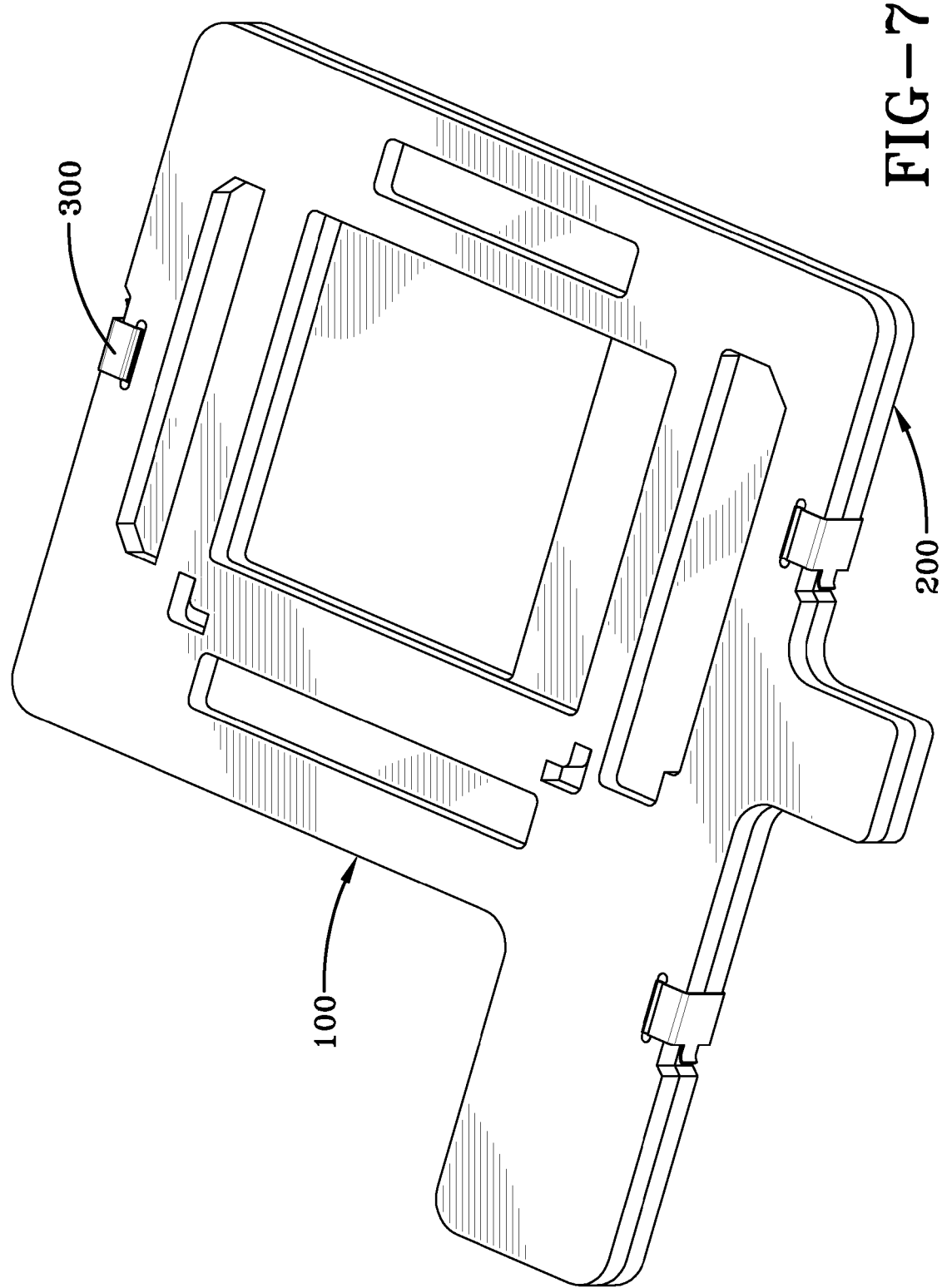
FIG. 7 shows a bottom perspective view of a third exemplary embodiment of a first carrier section and a second carrier section in the closed position where the first and second carrier sections are shown closed about an LCD and various drivers.
Figure 8:
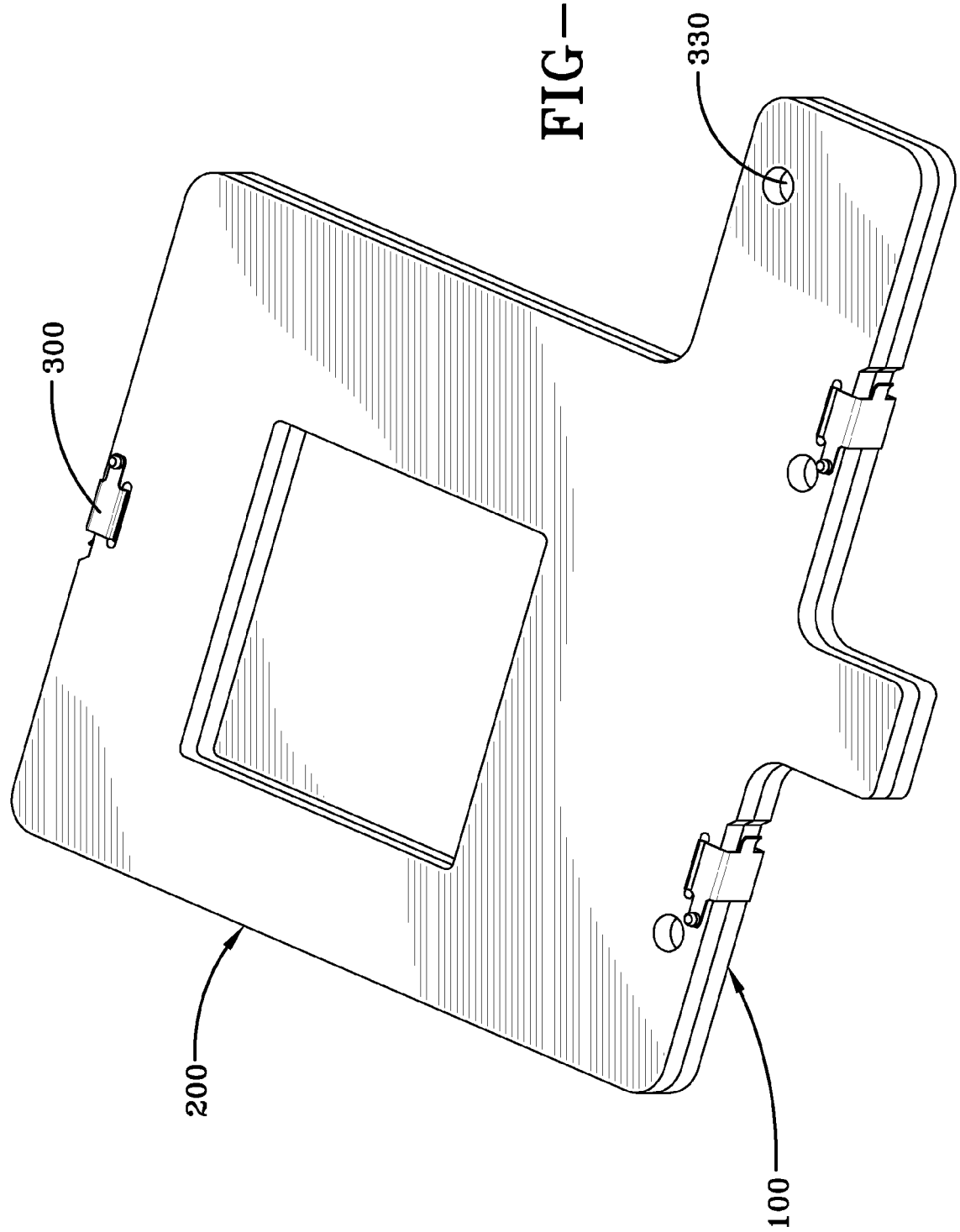
FIG. 8 shows a top perspective view of the exemplary embodiment of FIG. 7.

In some embodiments, a second carrier section 200 may be an exact mirror image of a first carrier section 100, but it may also be differently shaped. In a preferred exemplary embodiment, at least the outside edges of the second carrier section 200 are identical in shape to the outside edges of the first carrier section 100 such that the edges of the two carrier sections match up perfectly when the two carrier sections are mated together and placed into a closed position. FIG. 7 shows a bottom perspective view of a third exemplary embodiment of a first carrier section 100 and a second carrier section 200 having been mated together and placed into a closed position about an LCD and various drivers. In the exemplary embodiment of FIG. 7 the outside edges of the second carrier section 200 are identical in shape to the outside edges of the first carrier section 100 such that the edges of the two carrier sections match up perfectly when the two carrier sections are mated together and placed into a closed position. FIG. 8 shows a top perspective view of the exemplary embodiment shown in FIG. 7. It is not necessary for the outside edges of a first carrier section 100 and a second carrier section 200 to be identical in shape as is shown in FIGS. 7 and 8 and in fact, certain circumstances may arise where a variance in shape would be desired.

In certain exemplary embodiments, a first carrier section 100 and a second carrier section 200 comprise a cushioning segment 700. In a preferred exemplary embodiment, the cushioning segment 700 comprises a foam material. The foam may comprise polyurethane, but there are many types of foam on the market that may provide the desired cushioning properties to configure cushioning segment 700. In an exemplary embodiment where a first carrier section 100 and a second carrier section 200 comprise a cushioning segment 700, each carrier section may comprise an identically shaped piece of cushion that has been adhered to the carrier section. In this exemplary embodiment, the identically shaped pieces of cushion can be positioned onto the carrier sections such that when the carrier sections are mated together and placed in a closed position about an LCD, they provide gentle cushioning to two sides of the LCD. In some embodiments, a transportable carrier is adapted for receiving an LCD at least in part because it comprises a cushioning segment 700.

Figure 12:
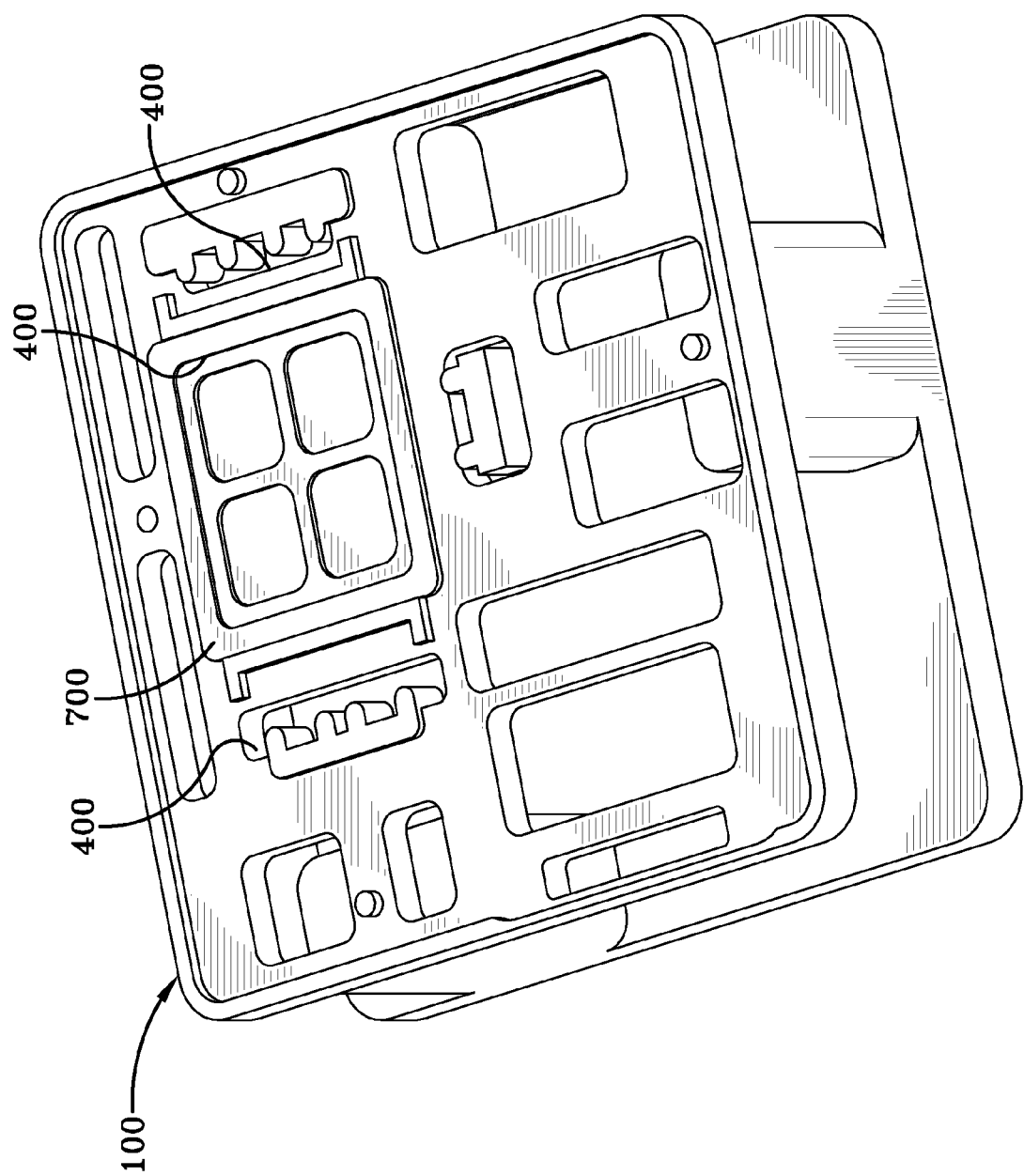
FIG. 12 shows a top perspective view of an exemplary embodiment of a first carrier section positioned about a retractable pin tool.
Figure 13:
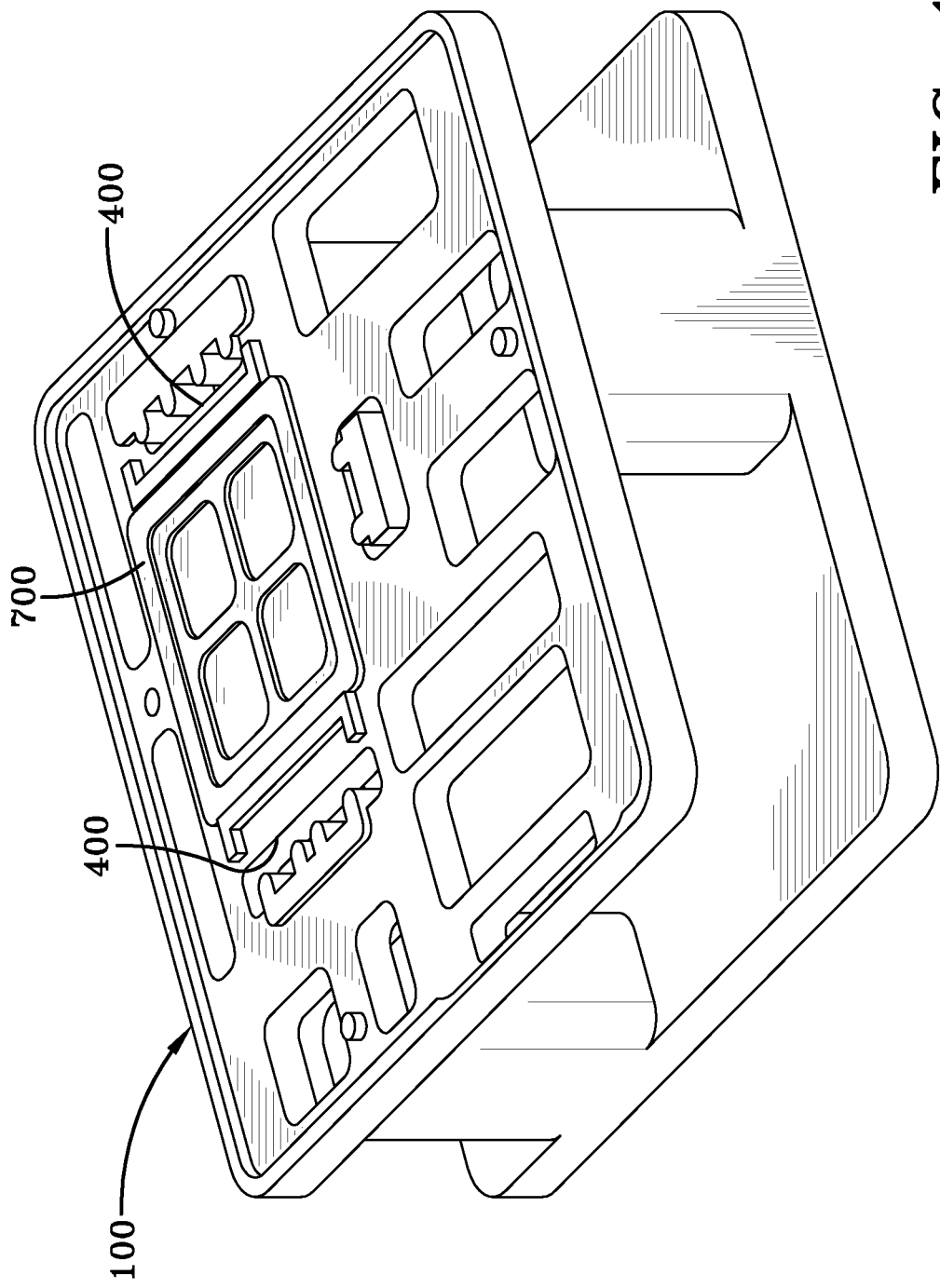
FIG. 13 shows a second top perspective view of the exemplary embodiment shown in FIG. 12.

FIG. 12 shows a top perspective view of an exemplary embodiment of a first carrier section 100 positioned about a retractable pin tool. The exemplary embodiment of a first carrier section 100 shown in FIG. 12 comprises a cushioning segment 700 that is rectangular in shape and that will provide cushioning to an LCD once it has been loaded into the first carrier section 100. FIG. 13 provides a second perspective view of the exemplary embodiment shown in FIG. 12. FIG. 14 shows a perspective view of the exemplary embodiment shown in FIG. 12 where the first carrier section 100 has been loaded with an LCD and various drivers. FIG. 14 shows how cushioning segment 700 can provide gentle support to an LCD that has been loaded into a first carrier section 100. In some exemplary embodiments where a first carrier section 100 comprises a cushioning segment 700 the cushioning segment 700 can do more than provide cushioning to an LCD that has been loaded into the first carrier section 100. For example, the cushioning segment 700 may also prevent the LCD from moving about in the carrier during processing, storage, etc.

While many exemplary embodiments comprise a first carrier section 100 and a second carrier section 200, in some exemplary embodiments, there is only a first carrier section 100. In exemplary embodiments comprising a first carrier section 100, but not a second carrier section 200, the carrier may be primarily utilized as a work surface for an LCD and its corresponding components. This is not to say that a first carrier section 100 can not be utilized as a protective carrier without the assistance of a second carrier section 200. In fact, in some exemplary embodiments, a first carrier section 100 is built such that it can be configured in open and closed positions about an LCD and its corresponding components without a second carrier section 200. Such a first carrier section 100 may comprise a hinging mechanism that assists in the opening and closing of the device. There are many ways a first carrier section 100 can be configured such that it may be placed in a closed and opened position about an LCD without the assistance of a second carrier section 200. For example, in some exemplary embodiments, numerous first carrier sections 100 may be built such that they can be mated with each other and in doing so each can be placed in a closed position about an LCD and its components. The mating together of more than one first carrier section 100 may be done by stacking one first carrier section 100 on top of another and so on. In one exemplary embodiment, where numerous first carrier sections 100 are stacked on top of each other to place at least some of those carrier sections in a closed position about an LCD and its components, it may be desirable to have at least one second carrier section 200 to place the first carrier section 100 that is located on the top of the stack in a closed position about the LCD it houses. In other exemplary embodiments, more than two carrier sections are utilized to form a protective carrier for an LCD and its corresponding components.

In a preferred exemplary embodiment, a carrier acts as a protective carrier for an LCD and its corresponding components when it consists of a first carrier section 100 and a second carrier section 200 that have been mated together and placed in a closed position about the LCD and its corresponding components. In another exemplary embodiment, a carrier can be used as a protective carrier when numerous first carrier sections 100 are mated together and placed in a closed position such as when they are stacked on top of each other. In some exemplary embodiments however, a carrier can be used as a protective carrier even when it is in an opened position. For example, the carrier may comprise sides that are tall enough to prevent liquids from splashing onto the contents of the carrier. Additionally, a carrier might protect an LCD and its components when a first carrier section 100 is secured to a work surface preventing slipping and other movement during processing of the LCD. There are many different ways that a transportable carrier can be used to protect an LCD and its components.

In some exemplary embodiments, a transportable carrier may be designed to accommodate a certain LCD and its corresponding components. For example, a first LCD and its corresponding components may require a carrier to be built in a shape that is substantially rectangular while a second LCD and its corresponding components may require a carrier to be built in a shape that is somewhat triangular and twice as large. This variation in shape and size arises because different LCD's are often bonded to different drivers. Because the shapes and sizes of different LCDs and drivers can vary vastly so will the shapes and sizes of the transportable carriers.

Preferred exemplary embodiments provide a work surface for the processing of an LCD and its components during different manufacturing steps. While many of these steps may implement a retractable pin tool, many of them may not. In one exemplary embodiment, a first or second carrier section is built to be mated with a work surface that is not a retractable pin tool or another carrier section. In other exemplary embodiments, a first and second carrier section are mated together and placed in a closed position about an LCD and its corresponding components and while in a closed position, they can be mated with a work surface other than a retractable pin tool.

Figure 9:
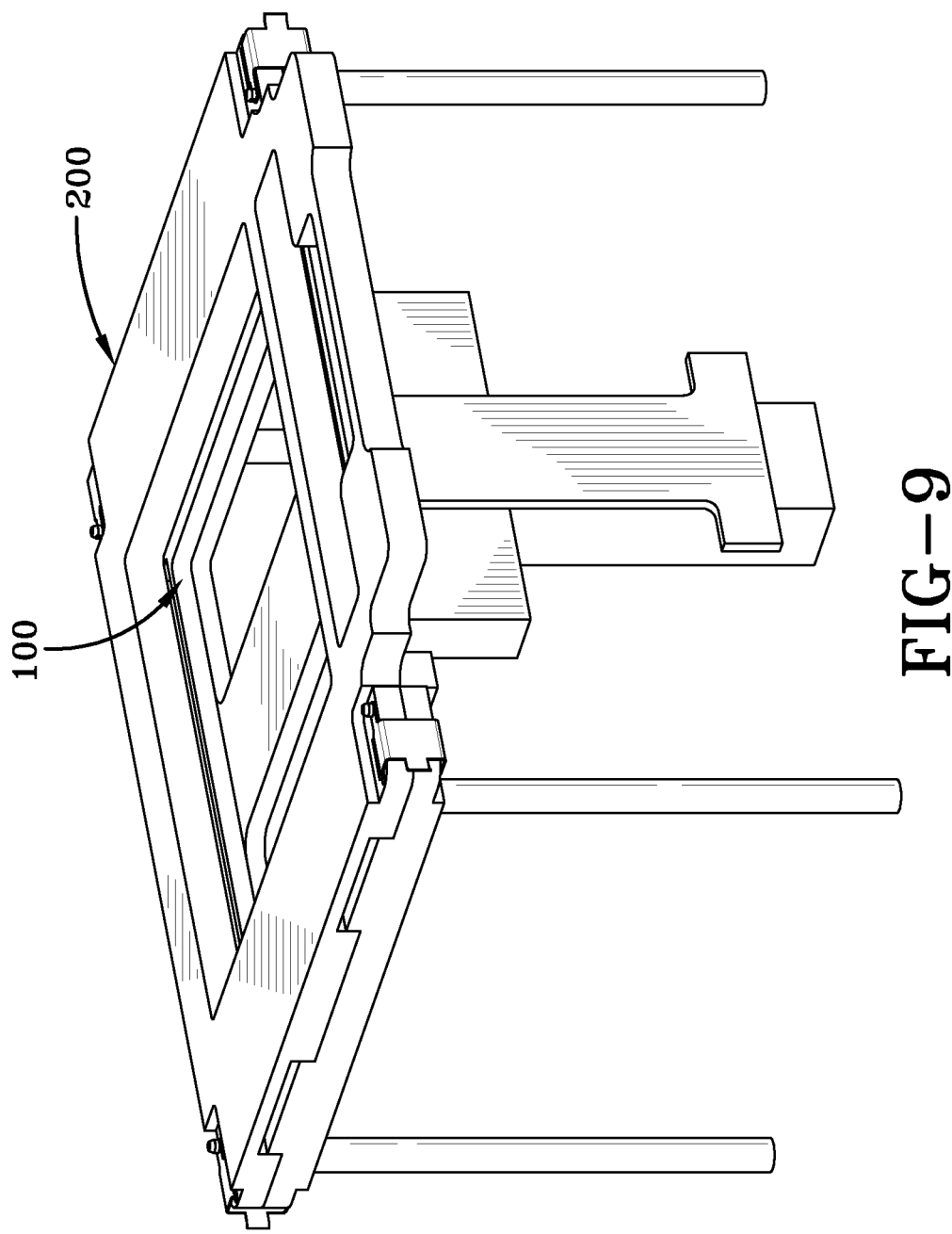
FIG. 9 shows an exemplary embodiment of second carrier section shown mated to an exemplary embodiment of a folding fixture.
Figure 10:
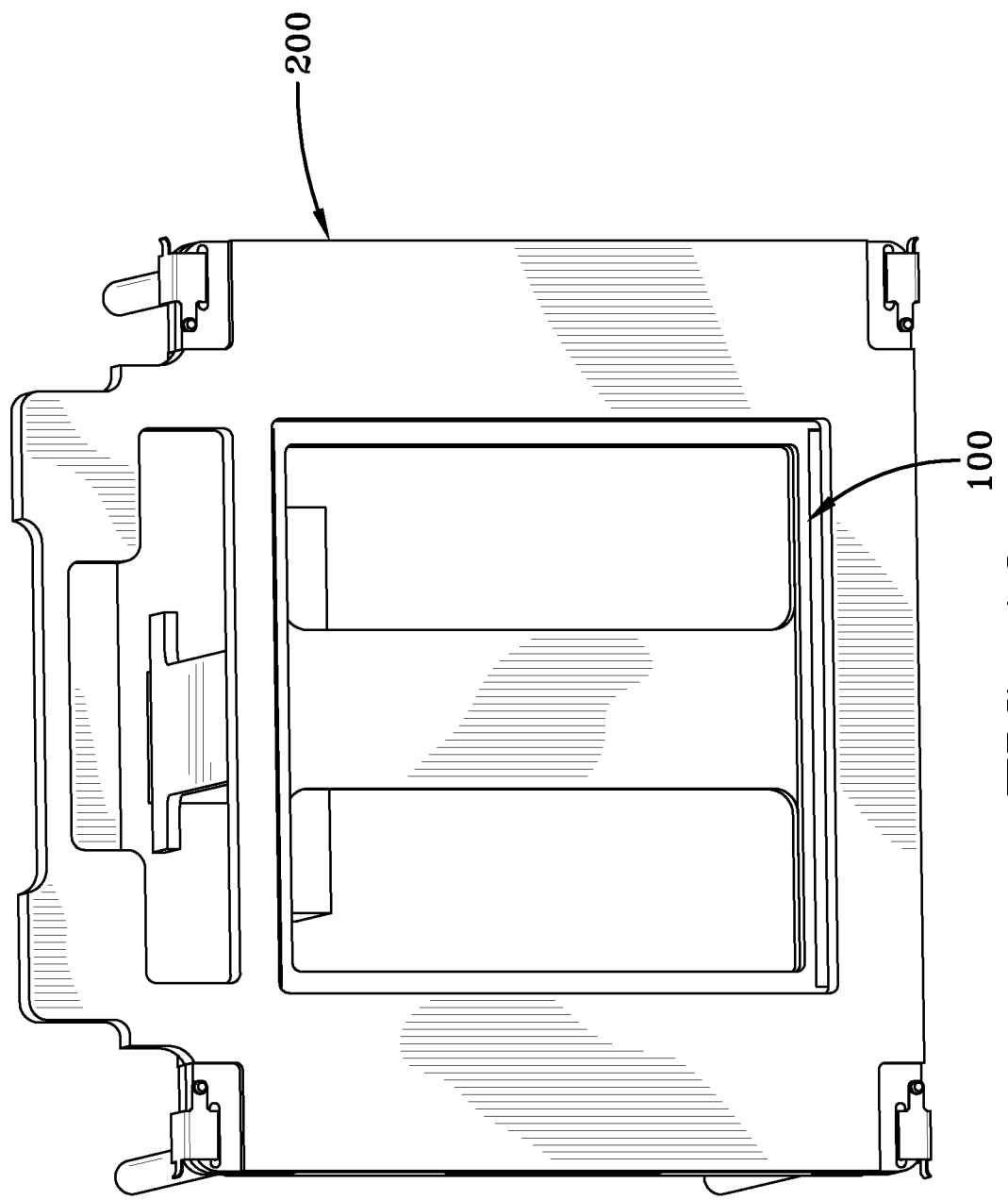
FIG. 10 shows a top view of the exemplary embodiment of FIG. 9.
Figure 11:
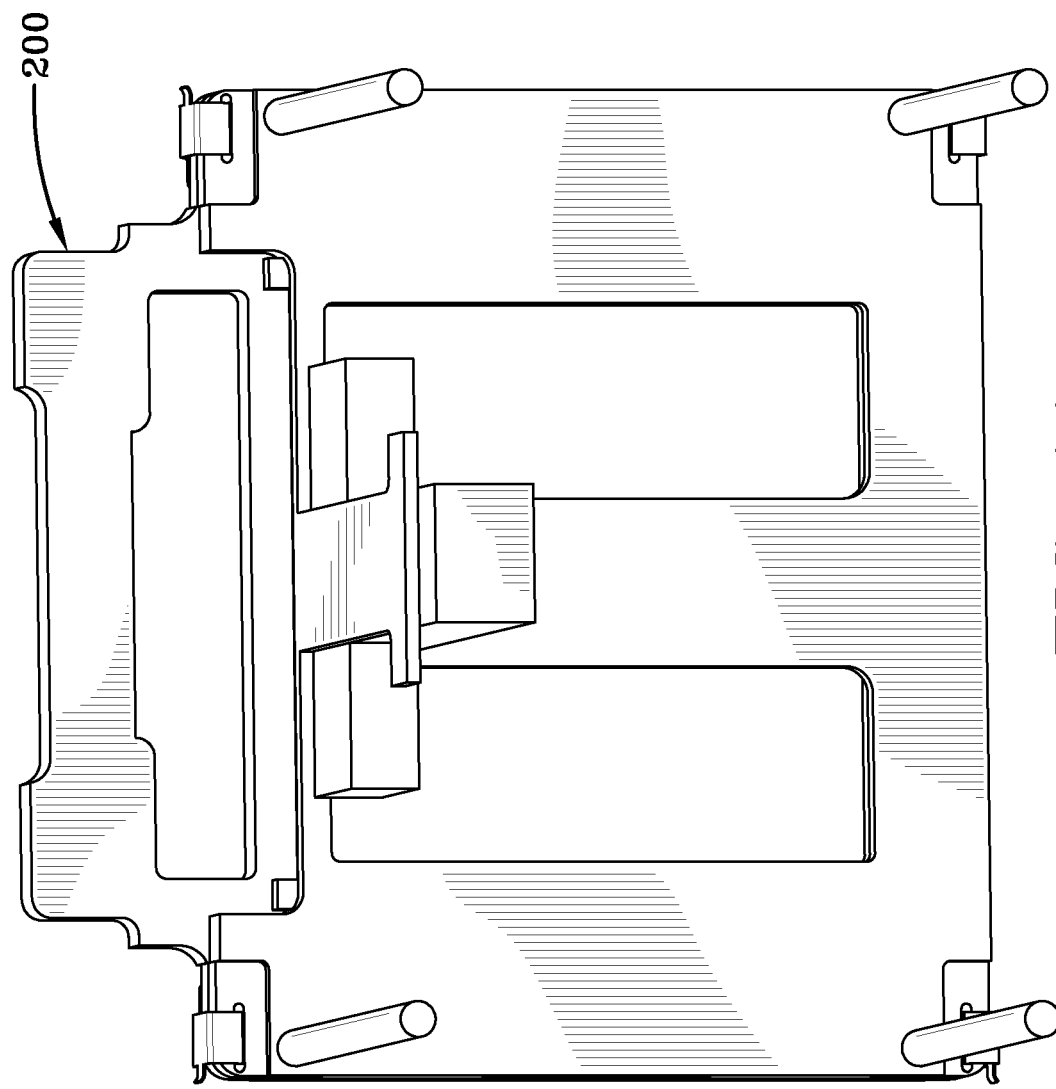
FIG. 11 shows a bottom view of the exemplary embodiment of FIG. 9.

In a preferred exemplary embodiment, a first carrier section and a second carrier section that have been placed in a closed position about an LCD may be mated with a folding fixture. FIGS. 9 through 11 show an exemplary embodiment of a first and second carrier section 100, 200 in a closed position where the carrier has been mated with an exemplary embodiment of a folding fixture. As can be seen in FIG. 9, the folding fixture may be designed such that it can be mated with the carrier and then secured to the carrier for processing. The top view shown in FIG. 10 shows that various clamping means may be utilized to secure a carrier to a folding fixture. FIG. 11 shows a bottom view of the exemplary embodiments shown in FIG. 9. A folding fixture is just one type of work surface that can be configured to be mated with a first or second carrier section to assist in the processing of an LCD and its corresponding components.

The exemplary embodiments herein disclosed are not intended to be exhaustive or to unnecessarily limit the scope of the invention. The exemplary embodiments disclosed were chosen and described in order to explain the principles of the invention so that others skilled in the art may practice the invention. Having shown and described exemplary embodiments of the invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A transportable carrier used in conjunction with a work surface for assembling an LCD with its driver comprising:
    a first carrier section having a first opening adapted to receive the LCD and a second opening adapted to receive a driver;
    a second carrier section having an opening for a portion of the LCD and a perimeter surrounding the opening which passes between the LCD and the driver; and
    a closing means for placing the first carrier section and the second carrier section in a closed position, encasing the LCD and its driver between the first carrier section and second carrier section.

2. The transportable carrier of claim 1 further comprising:
    a corresponding means for mating of the respective first and second carrier sections.

3. The transportable carrier of claim 1 where said work surface is a retractable pin tool.

4. The transportable carrier of claim 1 where said transportable carrier further comprises:
    a positioning means for positioning the first carrier section onto the work surface.

5. The transportable carrier of claim 1 wherein at least one of the first and second carrier sections comprises machined phenolic material.

6. The transportable carrier of claim 3 wherein said positioning means comprises a pin.

7. The transportable carrier of claim 1 where at least one of the first and second carrier sections defines:
    an opening for receiving a portion of the work surface.

8. The transportable carrier of claim 1 where said work surface comprises a table.

9. A transportable carrier used in conjunction with a work surface for assembling an LCD with its driver comprising:
    a first carrier section having a first opening adapted to receive the LCD and a second opening adapted to receive a driver;
    a positioning means for positioning the first carrier section onto the work surface;
    a second carrier section having an opening for a portion of the LCD and a perimeter surrounding the opening which passes between the LCD and the driver;
    means for mating of the first and second carrier sections; and
    a closing means for placing the first carrier section and the second carrier section in a closed position, encasing the LCD and its driver between the first carrier section and second carrier section.

10. The transportable carrier of claim 9 wherein said carrier further comprises:
    a cushioning means placed between the LCD and the second carrier section.

11. A method for carrying an LCD comprising the steps of:
    placing a first carrier section about a retractable pin tool; and
    loading the first carrier section with an LCD; and
    loading the first carrier section with a driver to be bonded to the LCD;
    mating a second carrier with the first carrier section, the second carrier section having an opening for a portion of the LCD and a perimeter surrounding the opening which passes between the LCD and the driver;
    placing the first carrier section and the second carrier in a closed position via a closing means, encasing the LCD between the first carrier section and second carrier section; and
    removing the first and second carrier section from their position about the retractable pin tool.

12. The method of claim 11 further comprising the step of making at least one bond between the driver and the LCD.

13. The method of claim 11 further comprising the steps of:
    loading the first carrier section with a driver to be bonded to the LCD; and
    engaging the driver with the retractable pin tool.

14. The method of claim 13 further comprising the steps of:
    making a bond between the driver and the LCD; and removing the first carrier section from its position about the retractable pin tool.

15. The method of claim 14 further comprising the step of:

mating the first carrier section with a work surface other than a retractable pin tool; and assembling components of the LCD.

\* \* \* \* \*